United States Patent
Boyd, IV et al.

[19]

[11] Patent Number: 6,158,944
[45] Date of Patent: Dec. 12, 2000

[54] AUTOMATED LASER BAR TRANSFER APPARATUS AND METHOD

[75] Inventors: John E. Boyd, IV, Blandon; Patrick J. Drummond, Hamburg; Raymond Frank Gruszka, Reading; John S. Rizzo, Oley, all of Pa.; Ping Wu, Berkeley Heights, N.J.; David J. Zangari, Pine Grove, Pa.

[73] Assignee: Lucent Technologies, Inc., Murray Hill, N.J.

[21] Appl. No.: 09/335,770

[22] Filed: Jun. 18, 1999

[51] Int. Cl.⁷ .................................................. B65G 1/00
[52] U.S. Cl. ................................ 414/331.01; 414/331.14; 414/331.16; 414/331.18; 414/752.1
[58] Field of Search ............................ 414/752.1, 331.01, 414/331.14, 331.16, 331.18

[56] References Cited

U.S. PATENT DOCUMENTS

| | | | |
|---|---|---|---|
| 4,506,455 | 3/1985 | Rossi | 414/331.01 |
| 4,979,464 | 12/1990 | Kunze-concewitz et al. | 414/331 |

*Primary Examiner*—Steven A. Bratlie
*Attorney, Agent, or Firm*—Dickstein Shapiro Morin & Oshinsky LLP

[57] ABSTRACT

A laser bar loading and unloading apparatus is disclosed. The apparatus includes a mounting surface, a movable coating fixture having a plurality of spacers, and at least a first vacuum source for providing a vacuum on a laser bar mounted on the mounting surface. The spacers are movable to place a fully loaded fixture in a closed position and to place an empty fixture in an opened position. A second vacuum source directs a vacuum on a laser bar to assist in moving the laser bar into the fixture and onto one of the spacers. A third vacuum source directs a vacuum on the loaded laser bars to maintain their position in the fixture.

37 Claims, 3 Drawing Sheets

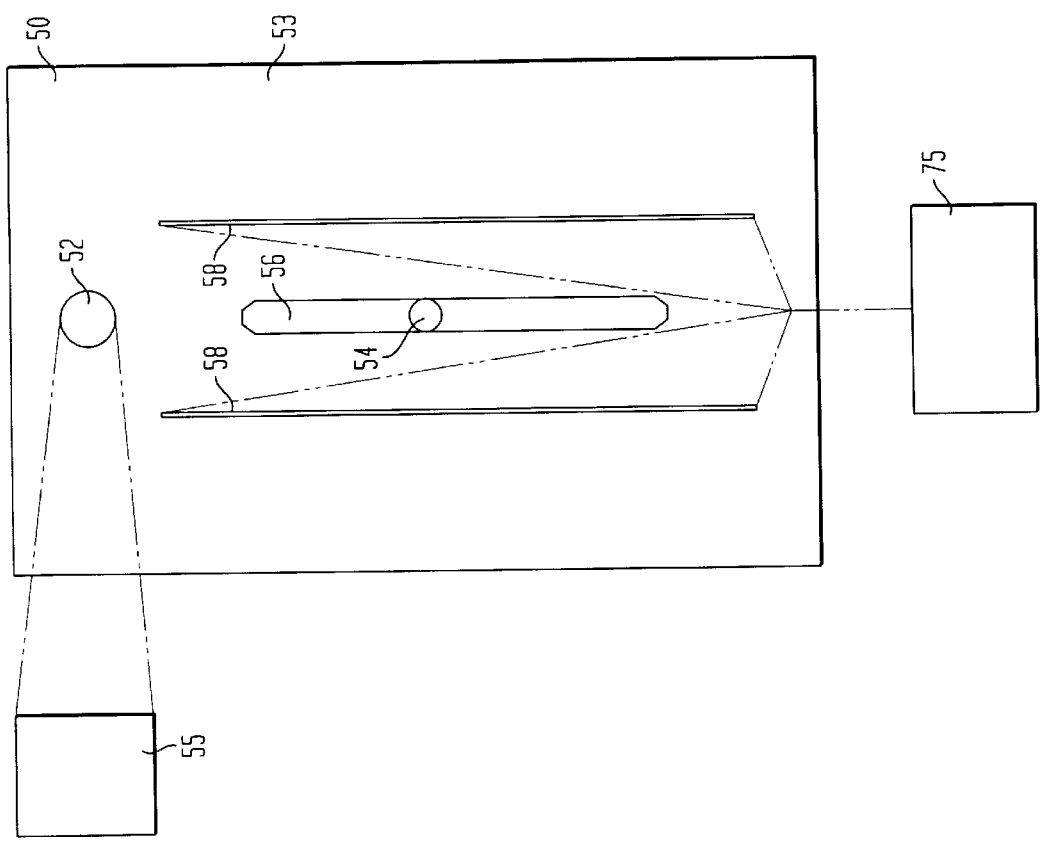
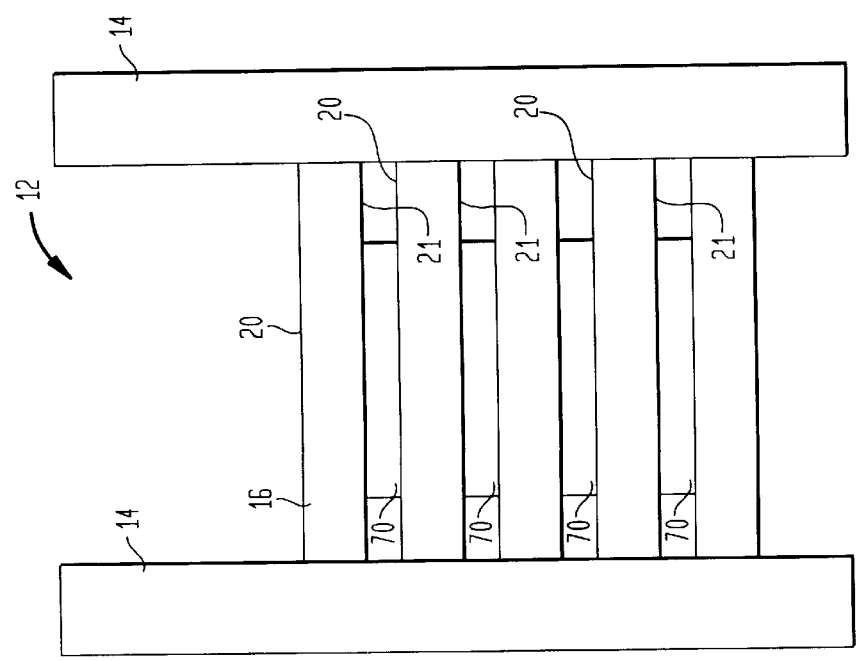

6,158,944

AUTOMATED LASER BAR TRANSFER APPARATUS AND METHOD

FIELD OF THE INVENTION

The present invention relates to an apparatus and method for use in processing laser bars. More particularly, the present invention relates to an apparatus and method for transferring laser bars to and from a laser bar coating station.

BACKGROUND OF THE INVENTION

Semiconductor chips are routinely manufactured in one location, coated in another location, and then transferred by a transportation apparatus to a third location for incorporation into electronic packages or devices. For example, during laser chip fabrication, the chips are formed from wafers. As an initial step, the wafers are scribed and broken into laser bars. It is then necessary to coat the edges of the laser bars with a coating. The coating is generally a dielectric, semi-reflective coating. The coating process generally occurs in an evaporator or other similar device.

Conventionally, laser bars are manually loaded onto a coating apparatus which is then transported to the evaporator for the coating process. Then, the coating apparatus is removed from the evaporator and the laser bars, now coated, are manually removed from the coating apparatus. A disadvantage of manually loading and unloading the coating apparatus is a lower than desired production yield caused by breakage of the laser bars during the loading and unloading process. Further, manual loading and unloading of laser bars is a labor intensive process.

SUMMARY OF THE INVENTION

The present invention provides a laser bar loading and unloading apparatus which includes a mounting surface, a movable laser bar holding apparatus, a vacuum source, and a tool for directing the laser bar onto the holding apparatus. The laser bars are sequentially loaded from the mounting surface to the holding apparatus and sequentially unloaded from the holding apparatus to the mounting surface. The first vacuum source exerts a vacuum on a laser bar on the mounting surface sufficient to lift the laser bar off the mounting surface, assisting the tool in directing the laser bar from the mounting surface to the holding apparatus.

The present invention also provides a method for loading and unloading a plurality of laser bars onto and from a transport apparatus. A first step includes locating the transport apparatus adjacent a laser bar mounting surface, wherein the transport apparatus has a plurality of holding devices and the transport apparatus is vertically movable relative to said mounting surface. Next, a laser bar is positioned on the mounting surface. A tool is positioned on the laser bar and a vertically upward vacuum is exerted on the laser bar to lift the laser bar off of the mounting surface and it directs the laser bar onto the transport apparatus. After loading of the laser bar is accomplished, the transport apparatus is moved relative to the mounting surface to align another holding device with the mounting surface in order to repeat the procedure of placing a laser bar on the mounting surface and moving it onto the transfer apparatus.

BRIEF DESCRIPTION OF THE DRAWINGS

FIG. 3 is a front view of the facet coating fixture of FIG. 1 in a closed position.

FIG. 4 is a back view of the vacuum platen of FIG. 1.

DETAILED DESCRIPTION OF PREFERRED EMBODIMENTS

With reference to FIGS. 1–4, there is shown a transfer apparatus 10 including a facet coating fixture 12, a staging platform 30, and a vacuum platen 50.

Figure 1:
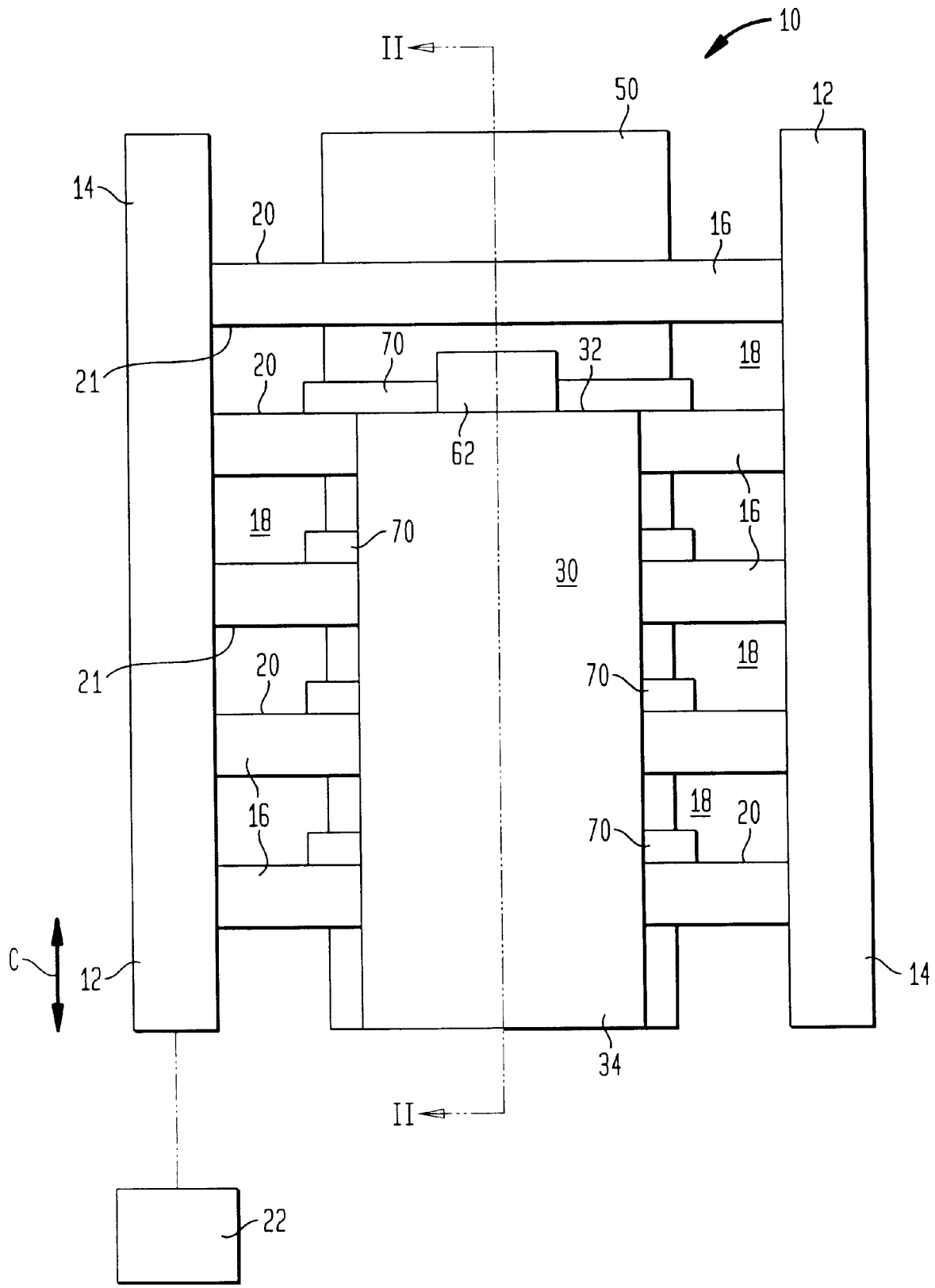
FIG. 1 is a front view of a transfer apparatus constructed in accordance with an embodiment of the present invention.
Figure 2:
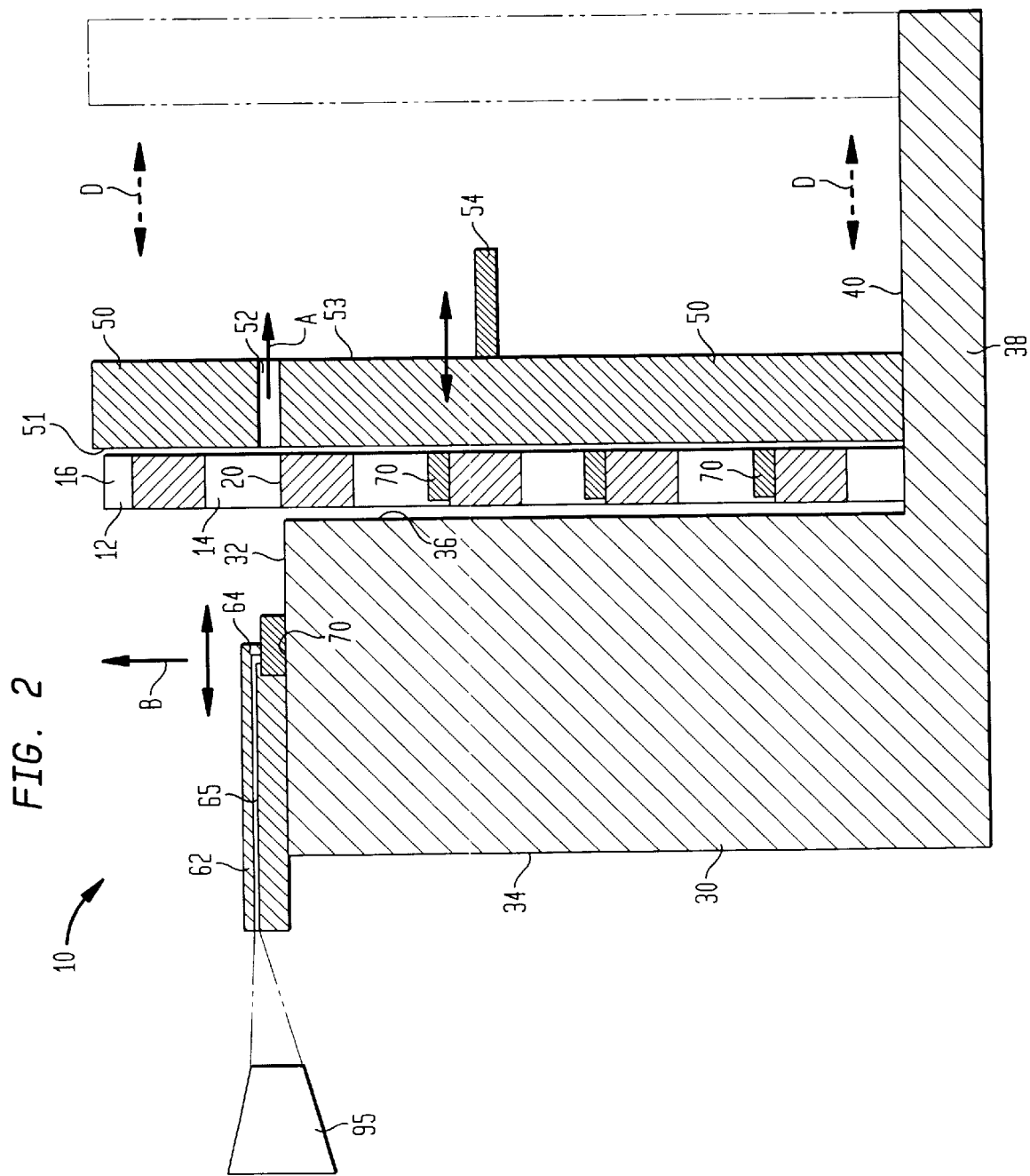
FIG. 2 is a cross-sectional view taken along line II—II of the transfer apparatus of FIG. 1.

The facet coating fixture 12 is preferably made of a metallic material, most preferably stainless steel. The facet coating fixture 12 has a pair of vertical legs 14 upon which are horizontally mounted a plurality of spacers 16. Each spacer includes a top surface 20 and a bottom surface 21. Interspersed between each two spacers 16 are slots 18. Preferably, there are twenty-eight slots 18 in a facet coating fixture, although that number can vary within the scope of the invention. Less than the preferred number of slots 18 are illustrated in FIGS. 1–3 for clarity of discussion of the invention.

The spacers 16 may be moved along the vertical legs 14 between an open position (FIGS. 1, 2) and a closed position (FIG. 3). The facet coating fixture 12 is capable of being elevated relative to the staging platform 30 by way of an elevator 22, shown schematically in FIG. 1. The elevator 22 may be any suitable apparatus for raising and lowering the facet coating fixture 12 in the direction of the arrows C in FIG. 1, such as, for example, a slide driven by a lead screw.

The staging platform 30 includes a top surface 32, a front side 34, a back side 36, and a platform leg 38 with a top surface 40. Laser bars 70 are sequentially mounted on the top surface 32 of the staging platform 30 for loading onto the facet coating fixture 12. Further, the laser bars 70 are sequentially offloaded onto the top surface 32 of the staging platform 30 after undergoing the coating process. A vacuum platen 50 (to be described in detail below) is movable along the top surface 40 of the platform leg 38. As with the facet coating fixture 12, the staging platform 30 is preferably formed of a metallic material, most preferably hardened steel.

The vacuum platen 50, which also is preferably formed of a metallic material, most preferably hardened steel, is a generally rectangular structure having a front surface 51 and a back surface 53. A vacuum opening 52 extends through the vacuum platen 50 from the front surface 51 to the back surface 53. The vacuum opening 52 is positioned at a height even with the top surface 32 of the staging platform 30. The vacuum platen 50 is spring biased toward the staging platform 30 at the base of the platen 50 near the top surface 40 of the leg 38. The movement of the platen 50 along the surface 40 is shown schematically in FIG. 2 by the dotted arrows D.

In addition to the vacuum opening 52, and in specific reference to FIG. 4, there are a pair of vertically aligned vacuum slots 58 which extend between the surfaces 51, 53. The vacuum slots 58 are used to keep the laser bars 70 properly positioned on the spacer top surfaces 20 of the facet coating fixture 12.

The vacuum platen 50 further includes a vertically aligned tapper slot 56. As shown in FIG. 2, a tapper bar 54 extends into the tapper slot 56. Alternatively, the platen 50 could include a pluralty of tapper holes instead of the tapper slot 56.

A bar tool 62 is positioned on the top surface 32 of the staging platform 30. The bar tool 62 includes a ledge 64 with a vacuum hole 65 which is used, in conjunction with a vacuum source 95, to direct the laser bar 70 into one of the slots 18 and onto one of the spacer top surfaces 20.

Next will be described the operation of the transfer apparatus 10. The vacuum platen 50 is moved in a direction away from the staging platform 30 along the top surface 40 of the platform leg 38 to allow entry of an empty facet coating fixture 12 between the back side 36 of the staging platform 30 and the front surface 51 of the vacuum platen 50. The vacuum platen 50 is spring-biased toward the staging platform 30 (FIG. 2), so that upon release the vacuum platen 50 will move into contact with the facet coating fixture 12.

Although the staging platform 30, the facet coating fixture 12, and the vacuum platen 50 are illustrated in FIG. 2 to be slightly separated, it is to be understood that these three components fit snugly together and the illustrated separation is to more clearly show and describe the invention.

Laser bars 70 are sequentially mounted on the top surface 32 of the staging platform 30 from an input location (not shown). The input location may be a waffle pack or a hoop having adhesive tape on it. Specifically, a robot arm having a vacuum attachment picks up a laser bar 70 and moves the bar 70 into contact with the top surface 32 of the staging platform 30. The bar tool 62 is then moved into place over the laser bar 70. The bar tool 62 exerts a vacuum from the vacuum source 95 (shown schematically in FIG. 2) in the direction of the arrow B. The vacuum has the effect of lifting the laser bar 70 slightly off the top surface 32 of the staging platform 30. Specifically, the tip of the vacuum hole 62 is designed to provide sufficient vacuum to lift the laser bar 70 approximately $1/1,000$ inch off of the top surface 32. Movement of the laser bar 70 off of the top surface 32 is important to prevent scoring of the top surface 32 by the cleaved surfaces of the laser bar 70.

The ledge 64 of the tool 62 is placed above a portion of the laser bar 70. The ledge 64 provides stability to the laser bar 70. The bar tool 62 is then moved in a direction toward the facet coating fixture 12, thereby pushing the laser bar 70, slightly above the surface 32, toward the facet coating fixture 12. To assist in the movement of the laser bar 70 onto the top surface 20 of one of the spacers 16, a vacuum is exerted from a vacuum source 55 (shown schematically in FIG. 4) in the direction of the arrow A through the vacuum opening 52. Further, a vacuum is exerted through the vacuum slots 58 in the direction of the arrow A (FIG. 2) from a vacuum source 75 (shown schematically in FIG. 4) to keep the laser bars 70 on the spacers 16.

Once a laser bar 70 has been loaded onto one of the spacers 16, the elevator 22 moves the facet coating fixture 12 to align another spacer 16 with the top surface 32 of the staging platform 30. It is immaterial whether one begins loading at the lowest spacer 16 and moves the fixture 12 downwardly or begins loading at the highest spacer 16 and moves the fixture 12 upwardly. The above-described process of moving the laser bar 70 onto the spacer 16 is repeated until the facet coating fixture 12 is completely filled. Once the facet coating fixture 12 is filled with laser bars 70, the spacers 16 are moved toward one another such that the bottom surface 21 of one spacer 16 comes in contact with a top surface of a laser bar 70, and the top surface 20 of the next adjoining spacer 16 comes in contact with a bottom surface of the laser bar 70. In this way, the facet coating fixture 12 is placed in a closed position (FIG. 3), thereby locking the laser bars 70 within the facet coating fixture 12 for transportation of the facet coating fixture 12 to the coating process. The vacuum platen 50 is then moved away from the staging platform 30 to allow removal of the facet coating fixture 12 to the evaporator.

The spacers 16 are movable along the legs 14 of the coating fixture 12 by way of a known mechanism. One such mechanism includes tracks on oppositely facing inward surfaces of the legs 14 in which the spacers 16 move and can be locked into place. The mechanism for locking the spacers 16 into place may be retractable dowels in the spacers 16 which extend and retract from openings spaced in the tracks on the legs 14. While it is not important how the spacers 16 move along the legs 14, it is important that the spacers 16 move so as to place the coating fixture 12 in an opened position and a closed position.

After the laser bars 70 have been coated, the facet coating fixture 12 is returned, still in the closed position, to the transfer apparatus 10. Again, the vacuum platen 50 is moved in a direction away from the staging platform 30 along the surface 40 of the platform leg 38 to allow the facet coating fixture 12 to be placed between the platen 50 and the staging platform 30. Once the facet coating fixture 12 is in place, the vacuum platen 50 springs back into position directly behind the facet coating fixture 12. The facet coating fixture 12 is then opened up, i.e., the spacers 16 are moved away from one another.

During the coating process, coating overspray often occurs which may adhere one or more laser bars 70 to the spacers 16. In addition, sometimes the laser bars 70, which have gold plating on the top and bottom surfaces, will fusion bond to the spacers 16 due to the pressure of the spacers 16 on the bars 70 when the facet coating fixture 12 is in the closed position. Thus, at times when the facet coating fixture 12 is moved from the closed position to the open position, some of the laser bars 70 remain adhered to the spacers 16.

After moving the facet coating fixture 12 into the open position, the tapper bar 54 is inserted into the tapper slot 56. The tapper bar 54 is adjusted along the tapper slot 56 to come in contact with and "tap" or strike each spacer 16. This tapping assists in breaking any bond that the laser bars 70 have with the spacers 16, thereby allowing smooth removal of the laser bar 70 from the facet coating fixture 12. Each of the coated laser bars 70 are then sequentially unloaded from the facet coating fixture 12 onto the staging platform 30, and returned to the input location (waffle pack or adhesive) for further processing or for assembly in an electronic component. Specifically, the bar tool ledge 64 is positioned over an unloaded laser bar 70 on the top surface 32, and a vacuum is exerted through the vacuum hole 65 from the vacuum source 95 to lift the laser bar 70 off the top surface 32 and move it to a pick up point on the top surface 32. Another vacuum tool (not shown) picks up the laser bar 70 and directs it back to the input location.

While preferred embodiments of the invention have been described and illustrated, the invention is not limited by the foregoing description as many modifications and substitutions can be made without departing from the spirit and scope of the invention. For example, while laser bars 70 are described as being loaded onto and unloaded from the coating fixture 12, any suitable semiconductor devices may be loaded onto and unloaded from the coating fixture 12. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A semiconductor device loading and unloading, apparatus, comprising:
   a mounting surface from which semiconductor devices are sequentially loaded and onto which semiconductor devices are sequentially unloaded;
   a movable holding apparatus to which semiconductor devices are sequentially loaded from said mounting surface and from which semiconductor devices are sequentially unloaded to said mounting surface;
   a first vacuum source exerting a vacuum on a semiconductor device on said mounting surface sufficient to lift the laser bar off said mounting surface;
   a second vacuum source exerting a vacuum along said mounting surface to sequentially pull the semiconductor devices into said holding apparatus; and
   a tool for moving a semiconductor device from said mounting surface to said holding apparatus.

2. The apparatus of claim 1, wherein said mounting surface is formed of a metallic material.

3. The apparatus of claim 2, wherein said metallic material is formed of stainless steel.

4. The apparatus of claim 1, wherein said holding apparatus comprises a pair of vertically aligned mounts and a plurality of holding devices, said holding devices being connected between and movable along said mounts.

5. The apparatus of claim 4, wherein said holding apparatus is movable between a opened position and a closed position.

6. The apparatus of claim 5, wherein said holding devices have a top and bottom surface, said opened position being defined by the presence of a space between a semiconductor device loaded onto a top surface of one said holding device and a bottom surface of another adjacent said holding device.

7. The apparatus of claim 6, wherein said closed position is defined by contact between each semiconductor device loaded onto one said holding device and the bottom surface of the other adjacent said holding device.

8. The apparatus of claim 5, wherein said holding apparatus and mounting surface are movable relative to each other, said movement allowing sequential loading and unloading of the semiconductor devices from and to said mounting surface.

9. The apparatus of claim 8, wherein said holding apparatus is movable and said mounting surface is stationary.

10. The apparatus of claim 5, further comprising:
    a wall positioned adjacent said holding apparatus and having a vertical slot adjacent to said holding devices when said holding apparatus is in the open position; and
    a rod receivable in said slot, wherein said rod extends through said slot and sequentially strikes each said holding device to release the semiconductor devices.

11. The apparatus of claim 1, wherein said first vacuum source lifts the semiconductor device approximately one-thousandth of an inch off said mounting surface.

12. The apparatus of claim 1, wherein said tool comprises a ledge adapted to receive and provide stability to the semiconductor device on said mounting surface.

13. The apparatus of claim 1, further comprising a third vacuum source exerting a vacuum to maintain the semiconductor devices in said holding apparatus.

14. The apparatus of claim 13, wherein said second and third vacuum sources exert the vacuums through a plurality of openings in a wall, said wall being spring-biased toward said holding apparatus.

15. The apparatus of claim 14, wherein said second vacuum source exerts a vacuum through one of said openings and said third vacuum source exerts a vacuum through a pair of said openings.

16. The apparatus of claim 15, wherein said pair of said openings are vertically aligned spaced apart slits in said wall.

17. The apparatus of claim 16, wherein said mounting surface is atop a base having a ledge upon which said wall is mounted and movable.

18. A semiconductor device loading and unloading apparatus, comprising:
    a mounting surface from which semiconductor devices are sequentially loaded and onto which semiconductor devices are sequentially unloaded;
    a movable holding apparatus to which semiconductor devices are sequentially loaded from said mounting surface and from which semiconductor devices are sequentially unloaded onto said mounting surface, wherein said holding apparatus comprises:
       a pair of vertically aligned mounts; and
       a plurality of holding devices being connected between and movable along said mounts, said holding devices each having a top and bottom surface;
    a first vacuum source exerting a vacuum on a semiconductor device on said mounting surface sufficient to lift the semiconductor device off said mounting, surface;
    a second vacuum source exerting a vacuum along said mounting surface to sequentially pull the semiconductor devices into said holding apparatus and to maintain the semiconductor devices in said holding apparatus; and
    tool for moving the semiconductor device from said mounting, surface to said holding apparatus.

19. The apparatus of claim 18, wherein said semiconductor devices are laser bars.

20. The apparatus of claim 18, wherein said mounting surface is formed of stainless steel.

21. The apparatus of claim 20, wherein said holding apparatus is movable between an opened position and a closed position, said opened position being defined by the presence of a space between a semiconductor device loaded onto a top surface of one said holding device and a bottom surface of another adjacent said holding device, said closed position being defined by contact between each semiconductor device loaded onto one said holding device and the bottom surface of the other adjacent holding device.

22. The apparatus of claim 21, wherein said holding apparatus is movable relative to said mounting surface, said movement allowing sequential loading and unloading of the semiconductor devices from and to said mounting surface.

23. The apparatus of claim 22, wherein said tool comprises a ledge adapted to receive and provide stability to the semiconductor device on said mounting surface.

24. The apparatus of claim 18, further
    comprising a third vacuum source exerting a vacuum to maintain the semiconductor devices in said holding apparatus.

25. The apparatus of claim 24, further comprising a wall having a first set of openings, said second vacuum source exerting a vacuum through one said opening and said third vacuum source exerting a vacuum through at least one other of said first set of openings.

26. The apparatus of claim 25, wherein said third vacuum source exerts a vacuum through a pair of vertically aligned slits in said wall.

27. The apparatus of claim 26, wherein said mounting surface is atop a base having a ledge, said wall being mounted on and movable along said ledge.

28. The apparatus of claim 27, wherein said wall is spring-biased toward said holding apparatus.

29. The apparatus of claim 28, wherein said wall comprises:

- a second set of openings, each opening of said second set being adjacent one of said holding devices when said holding apparatus is in the opened position; and
- a rod receivable in said second set of openings, wherein said rod sequentially extends through each of said second set of openings and strikes said holding devices to release the semiconductor devices.

30. A method of loading and unloading a plurality of laser bars onto and from a transport apparatus, wherein the transport apparatus has a plurality of holding devices, each having a top and bottom surface and being adapted to receive a laser bar, said method comprising:

- a.) locating the transport apparatus adjacent a mounting surface, the transport apparatus having a plurality of holding devices and the transport apparatus being vertically movable relative to said mounting surface;
- b.) positioning a laser bar on said mounting surface;
- c.) exerting a vertically upward vacuum on the semiconductor device to lift the laser bar off of said mounting surface;
- d.) moving the laser bar onto the transport apparatus;
- e.) moving the transport apparatus relative to said mounting surface;
- f.) repeating steps (b.) through (e.) until the transport apparatus is loaded with the laser bars; and
- g.) striking the holding devices to release any laser bars adhered thereto.

31. The method of claim 30, further comprising placing the transport apparatus in a closed position after being loaded with the laser bars, said closed position being defined by contact between each laser bar loaded onto one said holding device and the bottom surface of the next adjacent holding device.

32. The method of claim 31, further comprising removing the closed transport apparatus for processing of the laser bars.

33. The method of claim 32, further comprising returning the closed transport apparatus to its location adjacent said mounting surface and placing the transport apparatus in an opened position, said opened position being defined by the presence of a space between a laser bar on one of the holding devices and the bottom surface of the next above holding device.

34. The method of claim 30, further comprising positioning a wall, having a vertical slot, adjacent the transport apparatus, wherein said striking is accomplished sequentially with a rod extended through said slot.

35. The method of claim 30, further comprising exerting a second vacuum on each laser bar while directing the laser bar to the transport apparatus to pull the laser bar onto the transport apparatus and to maintain each laser bar in said holding apparatus.

36. The method of claim 30, further comprising:

exerting a second vacuum on each laser bar while directing the laser bar to the transport apparatus to pull the laser bar onto the transport apparatus; and exerting a third vacuum on each laser bar loaded onto the transport apparatus.

37. The method of claim 26, wherein said second and third vacuums are exerted through a wall placed adjacent to the transport apparatus, said second vacuum being exerted through an opening in said wall along said mounting surface, and said third vacuum being exerted through a pair of vertically aligned slits in said wall.

* * * * *